United States Patent [19]

Young

[11] Patent Number: 4,631,480
[45] Date of Patent: Dec. 23, 1986

[54] NUCLEAR MAGNETIC RESONANCE METHOD AND APPARATUS

[75] Inventor: Ian R. Young, Sunbury-on-Thames, England

[73] Assignee: Picker International Limited, Wembley, England

[21] Appl. No.: 539,008

[22] Filed: Oct. 4, 1983

[30] Foreign Application Priority Data

Oct. 13, 1982 [GB] United Kingdom ............... 8229193

[51] Int. Cl.[4] ............................................. G01R 33/20
[52] U.S. Cl. .................................... 324/309; 324/307
[58] Field of Search ............... 324/307, 308, 309, 311, 324/314, 318, 300; 378/18

[56] References Cited

U.S. PATENT DOCUMENTS

| 3,792,346 | 2/1974 | Gibby et al. | 324/314 |
| 4,050,009 | 9/1977 | Sagalyn et al. | 324/308 |
| 4,070,611 | 1/1978 | Ernst | 324/309 |
| 4,333,053 | 6/1982 | Harrison et al. | 324/309 |

FOREIGN PATENT DOCUMENTS

| 0042256 | 12/1981 | European Pat. Off. | |
| 0055058 | 6/1982 | European Pat. Off. | |
| 1033452 | 6/1966 | United Kingdom | 324/308 |
| 2037996 | 7/1980 | United Kingdom | |
| 2043914 | 10/1980 | United Kingdom | |
| 1584950 | 2/1981 | United Kingdom | |
| 2089996 | 6/1982 | United Kingdom | |

OTHER PUBLICATIONS

Hutchison et al., "NMR Imaging: Image Recovery Under Magnetic Fields with Large Non-Uniformities", Journal of Physics E: Scientific Instruments, vol. 11, 1978, pp. 217–221.

"Nuclear Magnetic Resonance (NMR) Imaging", edited by C. L. Partain et al., W. B. Saunders Co., 1983, No. 33, pp. 436–445, Philadelphia, U.S.A.; Schneiders, N. J. et al., Phantoms for NMR Image Analysis, (entire document).

Primary Examiner—Stewart J. Levy
Assistant Examiner—Kevin D. O'Shea
Attorney, Agent, or Firm—Watts, Hoffmann, Fisher & Heinke Co.

[57] ABSTRACT

In a method of imaging a body in which nuclear magnetic resonance is excited in a region including part of the body, and the free induction decay signal is measured, a quantity of a material of known nuclear magnetic resonance properties is included in the region so as to enhance the measured free induction decay signal. This then reduces the generation of noise during subsequent processing of the signal. The material is suitably water in a container.

6 Claims, 2 Drawing Figures

NUCLEAR MAGNETIC RESONANCE METHOD AND APPARATUS

This invention relates to methods of imaging of a body by nuclear magnetic resonance (NMR) techniques and apparatus arranged to perform such methods.

NMR techniques have been used for the chemical analysis of material for many years. More recently NMR techniques have been used to obtain images representing the distribution over a selected cross-sectional slice or volume of a body of a chosen quantity relating to NMR for example the density of chosen nuclei such as hydrogen protons, or of the NMR spin relaxation time constants $T_1$ and $T_2$. Such distributions are similar to, although of different significance from, the distribution of X-ray attenuation provided by computerised tomography systems.

It is an object of the present invention to provide a method of imaging of a body by NMR techniques and apparatus arranged to perform such a method wherein processing of signals received from the body relating to NMR is simplified.

According to the present invention in a method of imaging a body comprising nuclear magnetic resonance in a region including part of said body and measuring the free induction decay signal from said region, a quantity of a material of known nuclear magnetic resonance properties is included in said region so as to enhance the measured free induction decay signal and thereby reduce the generation of noise during subsequent processing of the signal.

Said material suitably comprises water in a container.

An apparatus arranged to carry out a method in accordance with the invention comprises: means for exciting nuclear magnetic resonance in a region including part of a body and means for measuring the free induction decay signal from said region; characterised in that it includes a quantity of a material of known nuclear magnetic resonance properties within said region.

Two methods and apparatus in accordance with the invention will now be described, by way of example only with reference to FIGS. 1 and 2 which illustrate the apparatus diagrammatically.

The methods are performed using an apparatus essentially identical to that described in U.S. Pat. Nos. 4,284,948 and 4,355,282 to which reference should be made for a fuller description, appropriately programmed to apply a sequence of magnetic field gradient and RF pulses and analyse the resulting signals as hereafter described.

The essential features of such an apparatus in so far as is required for an understanding of the present invention are as follows:

The apparatus includes a first coil system whereby a magnetic field can be applied to a body to be examined in a given direction, normally designated the Z-direction, with a gradient in any one or more of the three orthogonal directions i.e. X, Y and Z directions.

Figure 1:
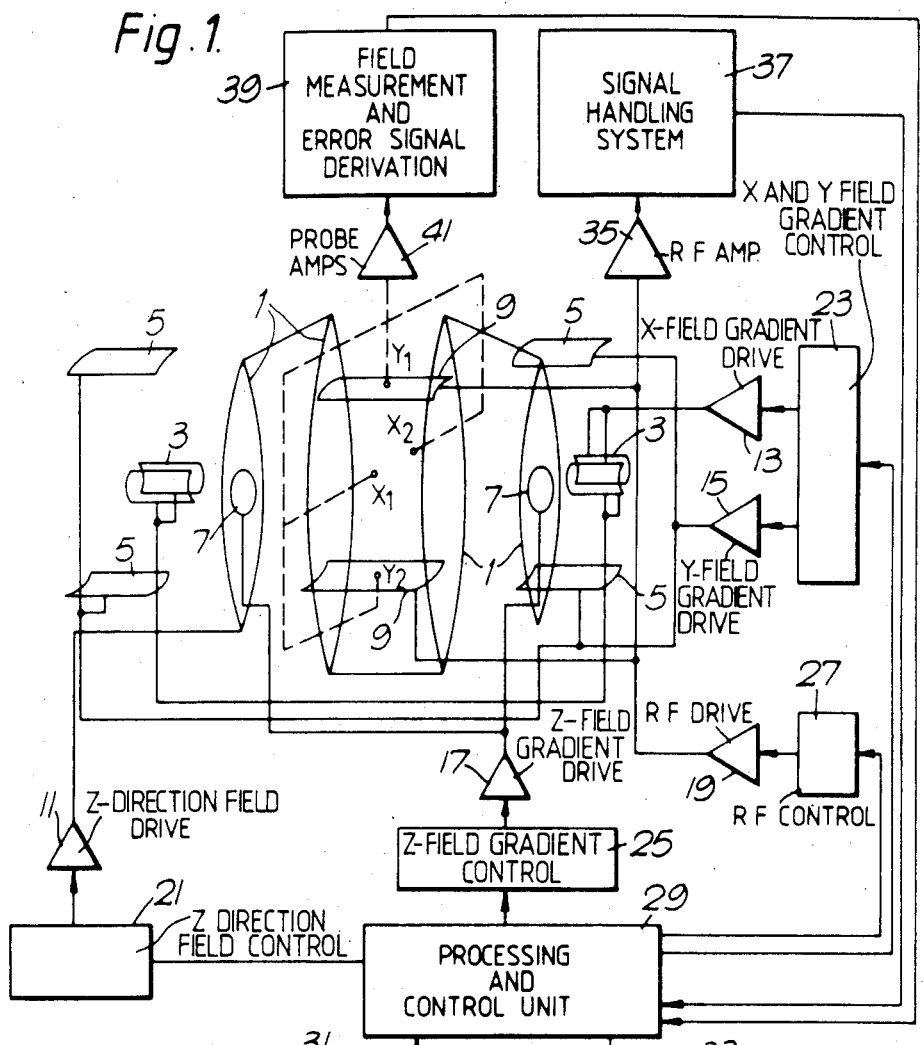
FIG. 1 is a diagram in partial block and schematic form illustrating an NMR system incorporating the present invention.
Figure 2:
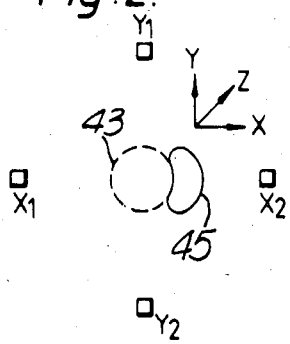
FIG. 2 is a diagram illustrating an aspect of operation of a portion of the system of FIG. 1.

Referring to FIG. 1, the first coil system comprises coils 1 capable of providing a steady uniform magnetic field in the Z direction; coils 3 capable of providing a magnetic field gradient in the X direction, coils 5 capable of providing a magnetic field gradient in the Y direction; and coils 7 capable of providing a magnetic field gradient in the Z direction.

In addition, the apparatus includes a second coil system 9 whereby RF magnetic fields can be applied to the body under examination in a plane normal to the direction of the steady uniform magnetic field produced by the first coil system, and whereby RF magnetic fields resulting from nuclei in the body under examination which have been excited to nuclear magnetic resonance with a spin vector component other than in the Z direction can be detected.

In the drawing a single pair of coils 9 is shown for both applying and detecting RF fields, but in certain circumstances it may be preferably to provide separate coils for detecting the RF fields.

The various coils 1, 3, 5, 7 and 9 are driven by drive amplifiers, 11, 12, 13, 15, 17 and 19 respectively, controlled by control circuits 21, 23, 25 and 27 respectively. These circuits may take various forms which are well known to those with experience of NMR equipment and other apparatus using coil induced magnetic field.

The circuits 21, 23, 25 and 27 are controlled by a central processing and control unit 29 with which are associated inputs and other peripherals 31, for the provision of commands and instructions to the apparatus, and a display 33.

The NMR signals detected by the coils 9 are applied via an amplifier 35 to a signal handling system 37. The signal handling system is arranged to make any appropriate calibration and correction of the signals, but essentially transmits the signals to the processing and control unit 29 wherein the signals are processed for application to the display to produce an image representing the distribution of an NMR quantity in the body being examined.

It will be appreciated that whilst shown separately to clarify the present description, the signal handling system 37 may conveniently form part of the unit 29.

The apparatus also includes field measurement and error signal circuits 39 which receive signals via amplifiers 41 from field probes $X_1$, $X_2$, $Y_1$ and $Y_2$ which are disposed at suitable positions in relation to a slice 43 to monitor the applied magnetic fields. Beside the slice is positioned a bag 45 containing a known volume of water.

The first method to be described concerns $T_1$ enhanced imaging of the body by the well known inversion recovery technique in which a first RF pulse sufficient to tip proton spins within a selected region defined by a particular value of the net magnetic field along the Z axis of the body through an angle of 180° is followed, after a time period t, by a second RF pulse which is sufficient to tip the spins through an angle of 90°. In such a technique the net signal measured by the coil system 9 from the excited spins precessing in the plane normal to the equilibrium magnetic axis defined by the steady uniform magnetic field produced by the coils 1 after the second pulse, varies from a negative signal to a positive signal dependent on the relative magnitudes of t and the distribution of spin lattice relaxation time $T_1$ for the spins. The discrimination of $T_1$ is greatest in the central region where the net signal measured tends towards zero, and it is thus particularly attractive to work in this region. Due to the small signal measured, however, it is very difficult to process this signal e.g. in phase correction processing, without generating a great deal of noise during the processing which depreciates the final image obtained of the body.

In accordance with the present invention this difficulty is overcome by providing within the region being excited the bag 45 containing water having a very short $T_1$ value compared to the weighted average of the $T_1$ values within the slice 43.

This water is excited by the RF pulses together with the slice 43 of the body and produces a large positive signal after time t when the net signal is detected by the coil system 9 and measured. The detected signal will therefore be relatively large and positive and the above mentioned signal processing difficulties are avoided.

The second example to be described concerns $T_2$ enhanced imaging of a body by the usual method in which a first RF pulse sufficient to tip proton spins within a selected region of the body through an angle of 90° is followed, after a time period t, by a second RF pulse which is sufficient to tip the spins through an angle of 180° to create a spin echo. When very long values of t are being used, the end signal measured is usually very small due to dephasing caused by the non-reversible spin-spin interaction, and it is thus again difficult to process the signal, without adding a large amount of noise during the processing. As water has a relatively large $T_2$ value, compared to the weighted average of the $T_2$ values within the slice 43 by including the bag 45 containing water within the region which is being excited by the RF pulse together with the slice 43 of the body, a larger signal is obtained, which can be used for initial processing, thus again reducing the amount of noise produced during processing of the signal.

It will also be appreciated that whilst the methods described herebefore relate to the excitation of protons, the methods are equally applicable to the excitation of any other nuclei having a spin e.g. $^{31}P$ by appropriate choice of the material of known nuclear magnetic resonance properties.

I claim:

1. A method of imaging a body comprising applying RF magnetic field pulses of a predetermined frequency effective to excite nuclear magnetic resonance in a region including part of said body, and measuring the free induction decay signal from said region, characterized in that a quantity of a material of known nuclear magnetic resonance properties, said quantity being excitable by said RF magnetic field pulses of a predetermined frequency, is included in said region so as to enhance the free induction decay signals from said region and thereby reduce the generation of noise during subsequent processing of the total free induction decay signal from said region.

2. A method according to claim 1 in which said method is an inversion recovery technique, and said material has a short $T_1$ value compared to the average $T_1$ value of said body.

3. A method according to claim 1 in which said method is a $T_2$ imaging method, and said material has a long $T_2$ value compared to the average $T_2$ value of said body.

4. A method according to claim 1 in which said material is water in a container.

5. An imaging apparatus comprising means for applying RF magnetic field pulses of a predetermined frequency effective to excite nuclear magnetic resonance in a region including part of a body and means for measuring the free induction decay signal from said region, characterised in that said apparatus includes a quantity of a material of known nuclear magnetic resonance properties within said region, said quantity being excitable by said RF magnetic field pulses of a predetermined frequency, said material being present in sufficient quantity to enhance said free induction decay signal, and further including means for processing said free induction decay signal contributed by said material for enhancing the signal to noise ratio of the total free induction decay signal from said region.

6. An apparatus according to claim 5 wherein said material is water in a container.

* * * * *